United States Patent
Healy et al.

(10) Patent No.: US 9,684,555 B2
(45) Date of Patent: *Jun. 20, 2017

(54) SELECTIVE MEMORY ERROR REPORTING

(71) Applicant: International Business Machines Corporation, Armonk, NY (US)

(72) Inventors: Michael B. Healy, Cortlandt Manor, NY (US); Hillery C. Hunter, Chappaqua, NY (US); Charles A. Kilmer, Essex Junction, VT (US); Kyu-hyoun Kim, Chappaqua, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/842,917

(22) Filed: Sep. 2, 2015

(65) Prior Publication Data

US 2017/0060657 A1  Mar. 2, 2017

(51) Int. Cl.
*H03M 13/00* (2006.01)
*G06F 11/07* (2006.01)

(52) U.S. Cl.
CPC .......... *G06F 11/079* (2013.01); *G06F 11/073* (2013.01); *G06F 11/076* (2013.01); *G06F 11/0772* (2013.01)

(58) Field of Classification Search
CPC .... G06F 11/079; G06F 11/073; G06F 11/076; G06F 11/0772
See application file for complete search history.

(56) References Cited

U.S. PATENT DOCUMENTS

| | | | |
|---|---|---|---|
| 8,255,639 B2 | 8/2012 | Heyrman et al. | |
| 8,301,938 B2 | 10/2012 | Cepulis et al. | |
| 9,165,050 B2 | 10/2015 | Schreter | |
| 2001/0016942 A1 | 8/2001 | Harrison et al. | |
| 2002/0016942 A1 | 2/2002 | MacLaren et al. | |
| 2006/0236165 A1 | 10/2006 | Cepulis et al. | |
| 2008/0091990 A1 | 4/2008 | Bruce et al. | |
| 2009/0217281 A1* | 8/2009 | Borkenhagen | G06F 11/1048 718/104 |
| 2013/0179473 A1 | 7/2013 | Heman et al. | |

(Continued)

OTHER PUBLICATIONS

Anonymous, "Error Correction for Large Memories," An IP.com Prior Art Database Technical Disclosure, Original Publication Date: Jun. 30, 1982, IP.com Electronic Publication: Apr. 4, 2004, 5 pages, IP.com No. 000024860.

(Continued)

*Primary Examiner* — Sam Rizk
(74) *Attorney, Agent, or Firm* — Joseph W. Cruz

(57) ABSTRACT

A correctable memory error may be identified at a first address within a memory device. Based on at least the identifying, a first correctable memory error count may be updated from a first quantity to a second quantity. The second quantity may be determined to exceed or not exceed a threshold. In response to the determining, the first correctable memory error count of the second quantity may be: converted to a third quantity and reported to a host device accordingly, reported to a host device, or not reported to a host device.

20 Claims, 9 Drawing Sheets

(56) References Cited

U.S. PATENT DOCUMENTS

| | | |
|---|---|---|
| 2013/0219108 A1* | 8/2013 | Yang .................. G06F 11/1068 711/103 |
| 2014/0075265 A1 | 3/2014 | Hung et al. |
| 2014/0089725 A1 | 3/2014 | Ackaret et al. |
| 2014/0164824 A1 | 6/2014 | Reche et al. |

OTHER PUBLICATIONS

Anonymous, "A Method for Recovering From Errors in Flash Memory," An IP.com Prior Art Database Technical Disclosure, IP.com Electronic Publication: Oct. 15, 2006, 32 pages, IP.com No. 000141800.

Kim et al., "DDR4E ECC," JEDEC, Global Standards for the Microelectronics Industry, item #1817.50, 2nd showing, Mar. 3, 2015, 10 pages, Grace Period Disclosure.

Barber, et al., "Reducing the Cost of Update, Delete, and Append-Only Insert Operations in a Database," U.S. Appl. No. 14/974,612, filed Dec. 18, 2015.

List of IBM Patents or Patent Publications Treated as Related, Dated Dec. 12, 2015, 2 pages.

"Accelerated Examination Support Document," International Business Machines Corporation, Dated Nov. 27, 2015, 7 pages.

\* cited by examiner

SELECTIVE MEMORY ERROR REPORTING

STATEMENT REGARDING PRIOR DISCLOSURES BY THE INVENTOR OR A JOINT INVENTOR

The following disclosure is submitted under 35 U.S.C. 102(b)(1)(A): DISCLOSURE: Title of Disclosure: "DDR4E ECC," Authors/contributors: Kyu-hyoun Kim, Warren Maule, Charles (Art) Kilmer, date made publicly available: Mar. 3, 2015, pages: 10.

BACKGROUND

This disclosure relates generally to memory devices, and more specifically, to selectively reporting memory errors.

A memory error is an event that leads to the logical state where the values read from one or more bits are different from the values that were last written. Memory errors, such as Direct Random Access Memory (DRAM) errors, are a concern because they can lead to machine crash or applications using corrupted data. Memory errors can be caused by electrical or magnetic interference (e.g., due to cosmic rays), problems with the hardware (e.g., a bit being permanently damaged), or can result from corruption along a data path between the memories and the processing elements. Memory errors can be classified as either soft errors, which randomly corrupt bits but do not leave physical damage, or hard errors, which corrupt bits in a repeatable manner due to physical defects in a memory device or data path.

Memory systems in server machines may employ error detecting and correcting mechanisms, including, for example, error correcting codes (ECC). ECC memories allow the detection and correction of single or multiple bit errors. An error is a correctable error (CE) when a system can reliably detect and correct at least a single erroneous bit. For example, single-error correcting and double-error detecting (SECDED) systems can detect double bit errors, but may only be able to correct single-bit errors.

SUMMARY

Various embodiments are directed to a computer-implemented method, a system, and a memory device. A correctable memory error may be identified at a first address within a memory device. Based on at least the identifying, a first correctable memory error count may be updated from a first quantity to a second quantity. The second quantity may be determined to exceed or not exceed a threshold. In response to the determining, the first correctable memory error count of the second quantity may be: converted to a third quantity and reported to a host device accordingly, reported to a host device, or not reported to a host device.

Figure 1:
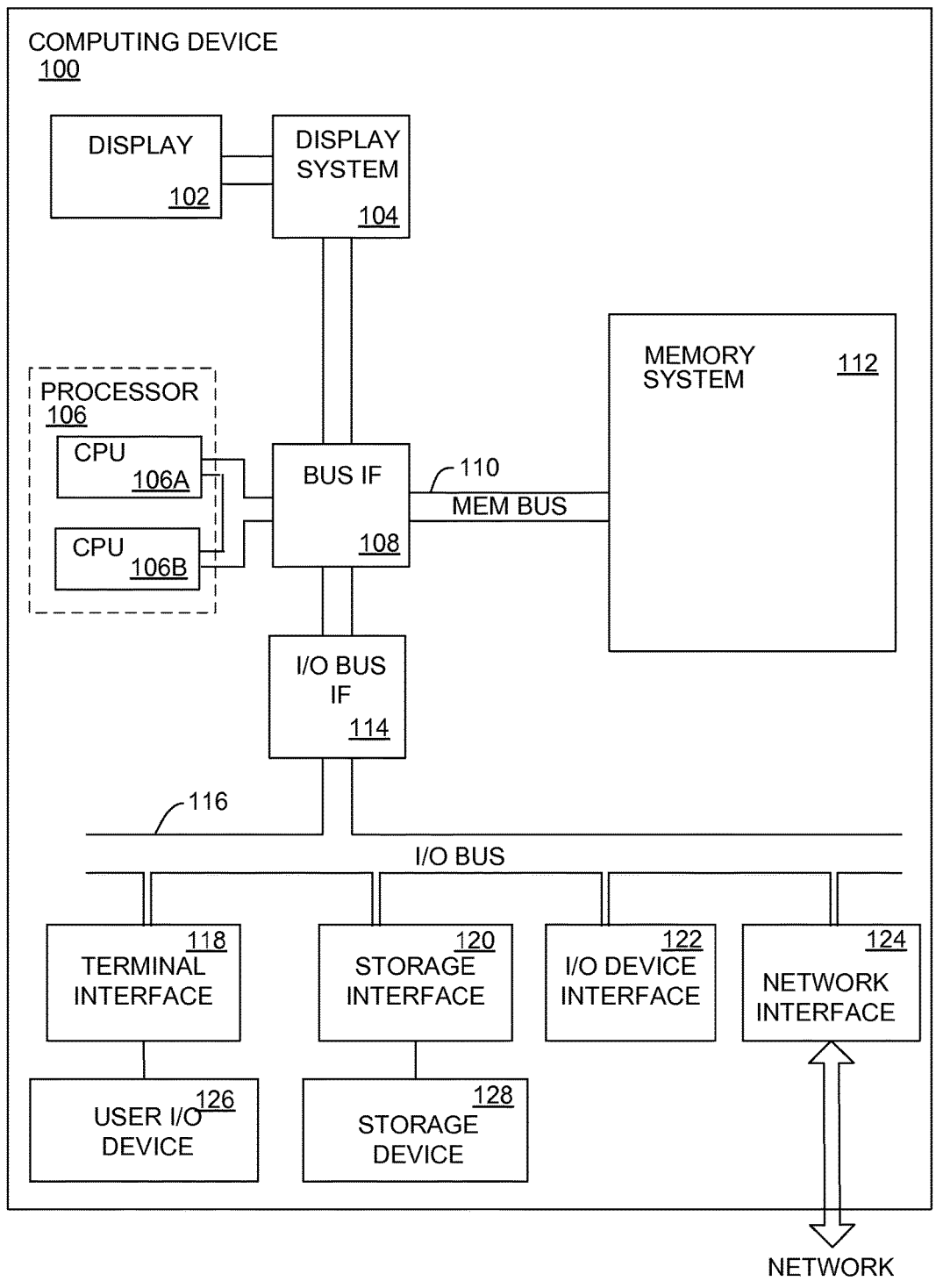
FIG. 1 is a block diagram illustrating an example computing device that includes a memory system, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to selectively reporting memory errors. While the present disclosure is not necessarily limited to such applications, various aspects of the disclosure may be appreciated through a discussion of various examples using this context.

Data may be received and transmitted through bits, which are the smallest units of data in a computing system. Bits may be expressed using values "0" or "1," and can be grouped together to create binary codes or data words (e.g., 8 bit data word 10110001). In some examples, memory devices that can detect memory errors may include an extra "check" bit (e.g., parity bit) or redundancy bits added on to a regular binary code sequence (e.g., 101100010). Depending on the system, the check bit(s) may help identify a memory error. In a system using even parity, for example, if the sum of all bits having a value of one in a binary code is even, the binary code may have "even parity" and may be error free. In the same system, when the sum of all bits having a value of one in a binary code is odd, the binary code may have an error (e.g., at least one bit value has flipped).

In some examples, ECC memory devices may employ one or more additional parity or check bits to correct memory errors. ECC memory devices and/or memory controllers may correct memory errors by matching an original copy of a code word (e.g., 64 bit data word plus additional parity bits) with a corresponding code word read from memory. Some examples of algorithms that may be utilized for ECC error correction are described herein. In some examples, at a first time, an encoder may encode (write) an encrypted code word sequence to memory. At a second time, when the code word is read from the memory, the stored ECC original code word may be compared against the code word that is generated when the data was read the second time. If the code word that was read does not match the stored code word, the code word that was read may be decrypted by a decoder to determine which parity bit was in error. The error may then be corrected by the decoder or other error corrector.

To decode a received word or message there may be a pre-processing step first in which a syndrome is calculated from a data word. In some examples, the syndrome is a vector whose length is equal to the redundancy bits. If the syndrome is an all-zero vector, then the received word may be a valid code word (i.e., there are no errors). The non-zero syndromes may have a one-to-one relationship with the error vectors provided the number of errors do not exceed the error correcting capability of the code. An error vector is a binary vector equal in length to an ECC code word. The decoding process may be defined as the mapping of a syndrome to the syndrome's associated error vector. Once an error vector is found, the corrected code word can be calculated using various algorithms (e.g., "exclusive or" (XORing) the error vector with the received word).

Memory geometry describes the internal structure of a memory device (e.g., transistor gates, memory arrays, etc.). Currently, memory error rates may be increasing because of the need for a smaller memory geometry and consequently there may be manufacturing difficulties to make the smaller geometries.

Correctable memory errors may be corrected within a memory device without a user ever being aware of the correction (i.e., the error is not reported to the user). Accordingly, ECC error correction may be utilized such that a memory device appears to be an error free memory device. However, if a memory device corrects all of the correctable memory errors without reporting such memory errors to a user, then the user may not be able to monitor progressive memory health and potentially prevent a more sever situation (e.g., a memory device that looks healthy may suddenly die). This may be particularly troublesome given the manufacturing difficulties of making smaller geometries and the resulting increased memory error rates. Notwithstanding the foregoing, memory device suppliers may argue that as long as the memory error is corrected, it should not be reported, as the data word itself is being read exactly the same as it was before the memory error. Moreover, memory device suppliers may desire not to report every single correctable memory error because some correctable memory errors are wrongly identified as memory errors. Further, memory device suppliers may also desire not to have memory devices report memory errors to users, as revealing a raw error count quantity, for example, may cause business disruption. In an illustrative example, customers may discover how the raw error rate or total number of errors is higher for a first supplier's memory device compared to other suppliers, which may cause a loss of business. Accordingly, embodiments of the present disclosure are directed to balancing the above-mentioned tension between users and memory suppliers by selectively reporting memory errors. Users may be given enough correctable memory error detail (e.g., reporting correctable memory errors above a threshold) to progressively monitor and manage memory health while at the same time the memory device or system may not report to users raw error rates or total number correctable errors that are below a threshold.

FIG. 1 is a block diagram illustrating an example computing device that includes a memory system, according to embodiments. The components of the computing device 100 can include one or more processors 106, a memory system 112, a terminal interface 118, a storage interface 120, an Input/Output ("I/O") device interface 122, and a network interface 124, all of which are communicatively coupled, directly or indirectly, for inter-component communication via a memory bus 110, an I/O bus 116, bus interface unit ("IF") 108, and an I/O bus interface unit 114.

The computing device 100 may include one or more general-purpose programmable central processing units (CPUs) 106A and 106B, herein generically referred to as the processor 106. In an embodiment, the computing device 100 may contain multiple processors; however, in another embodiment, the computing device 100 may alternatively be a single CPU device. Each processor 106 executes instructions stored in the memory system 112.

The computing device 100 may include a bus interface unit 108 to handle communications among the processor 106, the memory system 112, the display system 104, and the I/O bus interface unit 114. The I/O bus interface unit 114 may be coupled with the I/O bus 116 for transferring data to and from the various I/O units. The I/O bus interface unit 114 may communicate with multiple I/O interface units 118, 120, 122, and 124, which are also known as I/O processors (IOPs) or I/O adapters (IOAs), through the I/O bus 116. The display system 104 may include a display controller, a display memory, or both. The display controller may provide video, audio, or both types of data to a display device 102. The display memory may be a dedicated memory for buffering video data. The display system 104 may be coupled with a display device 102, such as a standalone display screen, computer monitor, television, a tablet or handheld device display, or another other displayable device. In an embodiment, the display device 102 may include one or more speakers for rendering audio. Alternatively, one or more speakers for rendering audio may be coupled with an I/O interface unit. In alternate embodiments, one or more functions provided by the display system 104 may be on board an integrated circuit that also includes the processor 106. In addition, one or more of the functions provided by the bus interface unit 108 may be on board an integrated circuit that also includes the processor 106.

The I/O interface units support communication with a variety of storage and I/O devices. For example, the terminal interface unit 118 supports the attachment of one or more user I/O devices, which may include user output devices (such as a video display devices, speaker, and/or television set) and user input devices (such as a keyboard, mouse, keypad, touchpad, trackball, buttons, light pen, or other pointing devices). A user may manipulate the user input devices using a user interface, in order to provide input data and commands to the user I/O device 126 and the computing device 100, may receive output data via the user output devices. For example, a user interface may be presented via the user I/O device 126, such as displayed on a display device, played via a speaker, or printed via a printer.

The storage interface 120 supports the attachment of one or more disk drives or direct access storage devices 128 (which are typically rotating magnetic disk drive storage devices, although they could alternatively be other storage devices, including arrays of disk drives configured to appear as a single large storage device to a host computer, or solid-state drives, such as a flash memory). In another embodiment, the storage device 128 may be implemented via any type of secondary storage device. The contents of data within the memory system 112, or any portion thereof, may be stored to and retrieved from the storage device 128 as needed. The I/O device interface 122 provides an interface to any of various other I/O devices or devices of other types, such as printers or fax machines. The network interface 124 provides one or more communication paths from the computing device 100 to other digital devices and computer systems.

Although the computing device 100 shown in FIG. 1 illustrates a particular bus structure providing a direct communication path among the processors 106, the memory system 112, the bus interface 108, the display system 104, and the I/O bus interface unit 114, in alternative embodiments the computing device 100 may include different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface unit 114 and the I/O bus 108 are shown as single respective units, the computing device 100, may include multiple I/O bus interface units 114 and/or multiple I/O buses 116. While multiple I/O interface units are shown, which separate the I/O bus 116 from various communication paths running to the various I/O devices, in other embodiments, some or all of the I/O devices are connected directly to one or more system I/O buses.

In various embodiments, the computing device 100 is a multi-user mainframe computer system, a single-user system, or a server computer or similar device that has little or no direct user interface, but receives requests from other computer systems (clients). In other embodiments, the computing device 100 may be implemented as a desktop computer, portable computer, laptop or notebook computer, tablet computer, pocket computer, telephone, smart phone, or any other suitable type of electronic device.

In an embodiment, the memory system 112 may include a random-access semiconductor memory, storage device, or storage medium (either volatile or non-volatile) for storing or encoding data and programs. The memory system 112 may represent the entire virtual memory of the computing device 100, and may also include the virtual memory of other computer systems coupled to the computing device 100 or connected via a network 130. The memory system 112 may be a single monolithic entity, but in other embodiments the memory 112 may include a hierarchy of caches and other memory devices. For example, memory system 112 may exist in multiple levels of caches, and these caches may be further divided by function, so that one cache holds instructions while another holds non-instruction data, which is used by the processor. Memory system 112 may be further distributed and associated with different CPUs or sets of CPUs, as is known in any various so-called non-uniform memory access (NUMA) computer architectures. The memory system 112 may include a memory controller and other components configured for selectively reporting memory errors, as discussed further below.

FIG. 1 is intended to depict representative components of the computing device 100. Individual components, however, may have greater complexity than represented in FIG. 1. In FIG. 1, components other than or in addition to those shown may be present, and the number, type, and configuration of such components may vary. Several particular examples of additional complexity or additional variations are disclosed herein; these are by way of example only and are not necessarily the only such variations. The various program components illustrated in FIG. 1 may be implemented, in various embodiments, in a number of different ways, including using various computer applications, routines, components, programs, objects, modules, data structures etc., which may be referred to herein as "software," "computer programs," or simply "programs."

Figure 2:
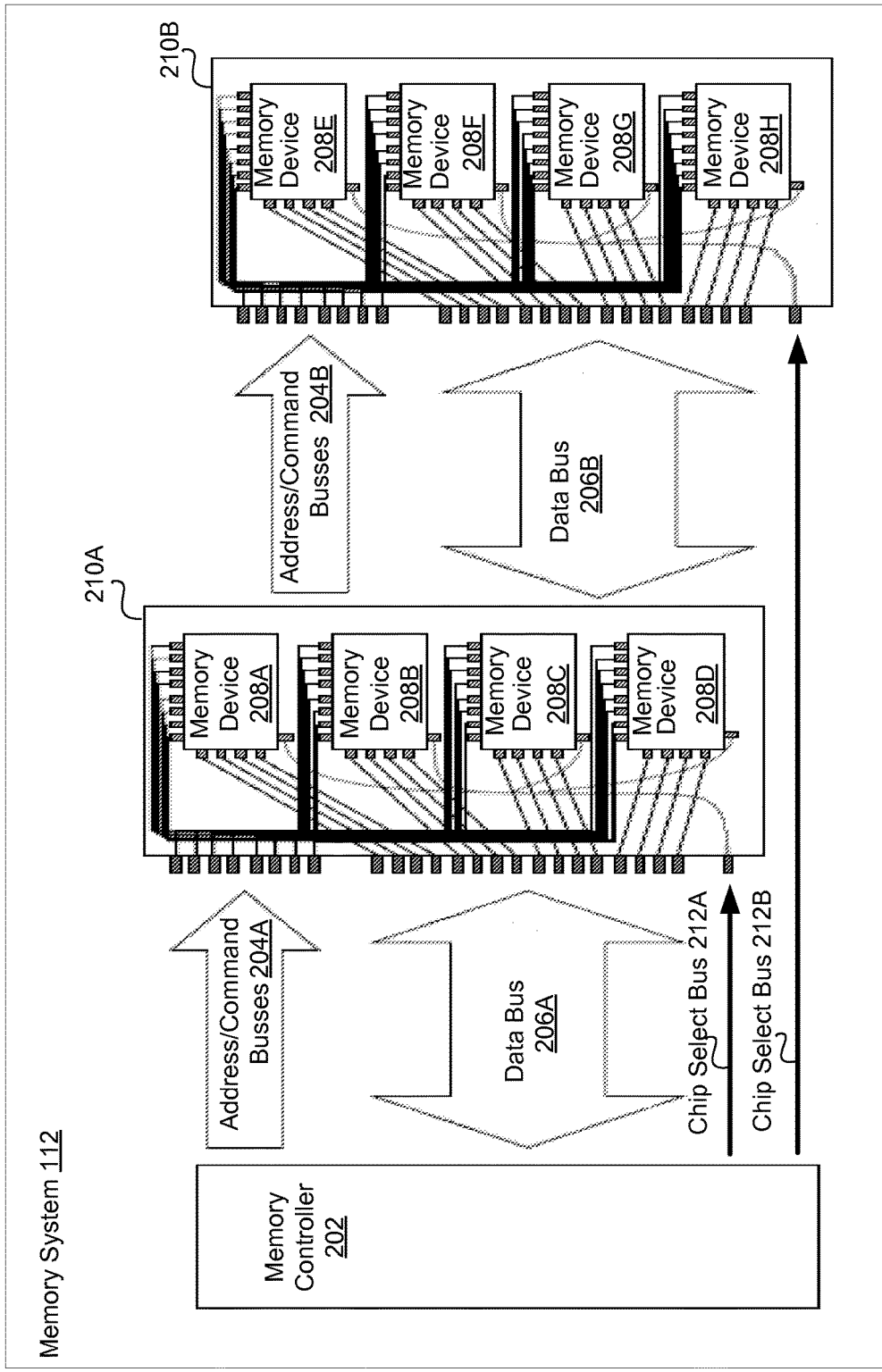
FIG. 2 is a block diagram illustrating an example of the memory system of FIG. 1, according to embodiments.

FIG. 2 is a block diagram illustrating an example of the memory system of FIG. 1, according to embodiments. Consistent with some embodiments, the memory system 112 may include a memory controller 202, address/command busses 204A and 204B, data buses 206A and 206B, chip select buses 212A and 212B (buses 204, 206, and 212 may correspond with the memory bus 110 of FIG. 1), and memory modules (e.g., ranks) 210A and 210B. The memory modules 210A and 210B may include respective memory devices 208 (e.g., DRAMS). For example, memory module 210A may include memory devices 208A, 208B, 208C, and 208D. Memory module 210B may include memory devices 208E, 208F, 208G, and 208H. The memory system 112 may also be registered (buffered), unbuffered, or fully buffered.

The memory controller 202 is a circuit host device that manages the flow of data to and from a computing device's memory. In some embodiments, the memory controller 202 may include a central processing unit (CPU) or a logic circuit. The CPU or logic circuit may be configured to control the general operation of the memory controller 202 in response to read/write requests by a computing device. The memory controller 202 may also include one or more buffers to temporarily store read/write data between transfers from the memory array 222 and the computing device. The memory controller 202 may support data flow from a computing device to a memory array via system buses (e.g., memory bus 110 of FIG. 1, address/command busses 204A and 204B, and data buses 206A and 206B). The memory controller 202 may also control the writing and reporting of various memory errors, according to some embodiments. In other embodiments, a memory device may control the writing and reporting of various memory errors. In still other embodiments, hardware or software component of a computer system that is distinct from a memory device or controller may control the writing and reporting of various memory errors. For example, as described in more detail below, if a correctable memory error count exceeds a threshold, a memory device may report a memory error count to the memory controller 202. In some embodiments, the memory controller includes 202 ECC circuitry to detect and correct memory errors. In some embodiments, the memory controller 202 includes firmware for monitoring memory health and memory management (e.g., to determine whether to replace memory, spare or mark memory as faulty, etc.). For example, the firmware may be a reliability, accessibility, and serviceability (RAS) module to assess and monitor memory health.

In some embodiments, address/command busses 204A and 204B are utilized to select a memory location within each of the memory devices 208. Address pins may be utilized for both row and column address selection within a memory array of the memory devices 208. In some embodiments, a host device (e.g., the memory controller 202) inputs an address without receiving a request from a user. In other embodiments, a user may issue a command to be performed at a particular address. For example, as described in more detail below, a user may issue a "special" read command to obtain a raw or total error count quantity. In various other embodiments, other host devices may be utilized to select a memory location for performing special read commands. Although the width of the address/command busses 204A and 204B are illustrated as being 8-bits, the address/command busses can be any suitable width. For example, the bus width may be 16 bits or 32 bits, depending on the number of bits stored to each memory device 208.

In various embodiments, the data busses 206A and 206B are utilized for data input and output. For example, during a write operation to store a code word to memory, a data signal may be applied from the memory controller 202 to the data bus 206A and respective pins of the memory device 208. The data may then be translated to the appropriate signal levels and stored to the appropriate memory cell of a memory array (within the memory devices 208). Although the data busses 206A and 206B are illustrated as being 16 bits wide, the data buses 206A or 206B may be any suitable width. For example, the data buses may be 32 bits, 72 bits (accounting for ECC bits), etc.

In embodiments, the chip select busses 212A and 212B are utilized by the memory controller 202 to select an appropriate memory module 210A or 210B so as to enable (or block) input signals to the memory module needed for an operation. For example, when a user (or host device) issues a command to read data located within memory device 208B, chip select bus 212A may activate memory module 210A to allow the read to occur.

In some embodiments, each memory module 210A and 210B is an integrated circuit module mounted on a printed circuit board, and houses the memory devices 208. The memory modules 210A and 210B may be any suitable module. For example, the memory modules 210A or 210B may be a dual in-line memory module (DIMM), a single in-line memory module (SIMM), a single in-line pin package memory (SIPP), a Trans Flash memory module, or any other suitable memory module. Although each memory module 210A and 210B is illustrated as including 4 memory devices 208 per module (e.g., 208A, 208B, 208C, and 208D), the quantity of memory devices per module may be any suitable quantity. For example, in some embodiments, there are 9 memory devices 208 per module and one of the memory devices (e.g., 208A) is used solely to detect and correct memory errors (e.g., an ECC memory device). In some embodiments, there are 18 memory devices 208 in each module. In various embodiments, the memory modules 210A and 210B include any number of memory devices 208 as long as the number of memory devices is divisible by 3 or 5 to account for the ECC detection and correction.

Figure 3:
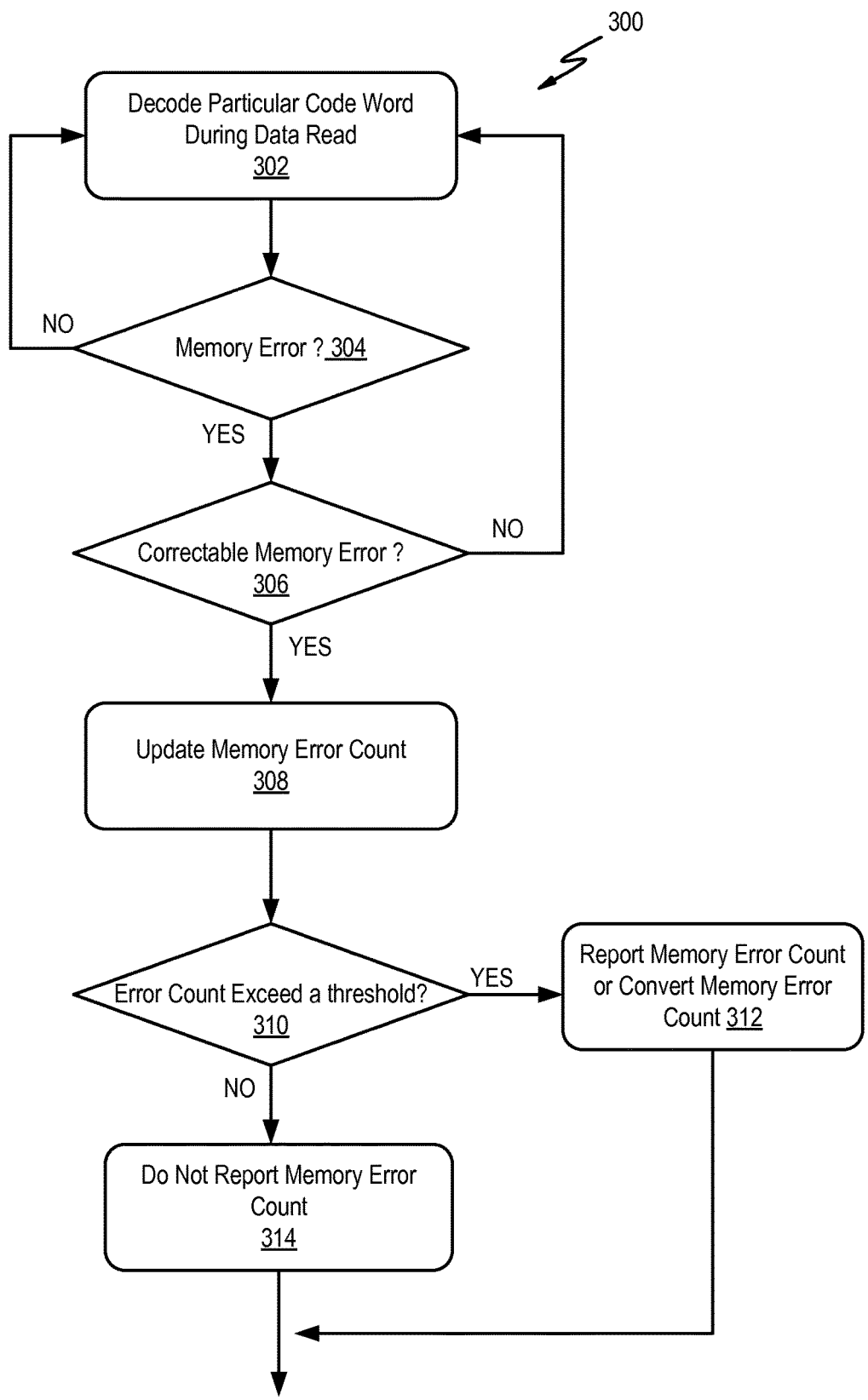
FIG. 3 is a flow diagram of an example process for determining whether a memory error count exceeds a threshold and reporting or converting the memory error count accordingly with respect to embodiments.

FIG. 3 is a flow diagram of an example process 300 for determining whether a memory error count exceeds a threshold, and reporting or converting the memory error count accordingly with respect to embodiments. In some embodiments, the process 300 begins, per block 302, when an ECC decoder within a memory device decodes a particular code word (e.g., data word with check bits) during a data read by comparing the generated code words read during data retrieval to the code words stored during a write operation. In some embodiments, per block 304, if the code words match, that means there is no memory error, and the memory controller or ECC decoder may continue to perform operation 302 for different data reads until the memory device detects one or more memory errors.

If there is a memory error then the memory device may, per block 306, determine whether the error is a correctable memory error. As described herein, the term "correctable memory error" may mean that the amount of errors does not exceed a quantity in which the memory device can correct. In some embodiments, a correctable memory error may be a soft error, as opposed to a hard error. In some situations, correctable memory errors are never reported, as the memory device or memory controller may automatically correct the memory errors without user feedback. However, as discussed above, not reporting correctable memory errors may not provide a realistic health state of the memory device. If the error is not a correctable memory error, then block 302 may continue to be performed for different code words for different data retrievals. If the memory error is correctable, then per block 308, an error counter (as discussed in more detail below) may update the memory error count based on the identifying of the memory error. For example, the memory error count may be updated from 9 to 10 as soon as an additional memory error is detected for a particular code word.

Per block 310, a threshold module (discussed in more detail below) within the memory device (or within a memory controller in some embodiments) may determine whether the memory error count exceeds a threshold. For example, using the illustration above, if the threshold quantity was any detected memory errors of 10 or more, and the memory errors detected went from 9 to 10 memory errors, then per block 312, the memory device may report the memory error count (e.g., there are 10 memory errors). Alternatively, a number converter module within the memory device (or within a memory controller in some embodiments) may convert the memory error count to a different number, as described in more detail below (e.g., convert error count of 10 to 7 memory errors such that the memory device reports to a host device that there is 7 memory errors instead of 10). In some embodiments, a module may both compare an error count with a threshold and perform a number conversion. If the memory error count does not exceed the threshold, then per block 314, the memory device may select or choose to not report the memory error count.

Figure 4:
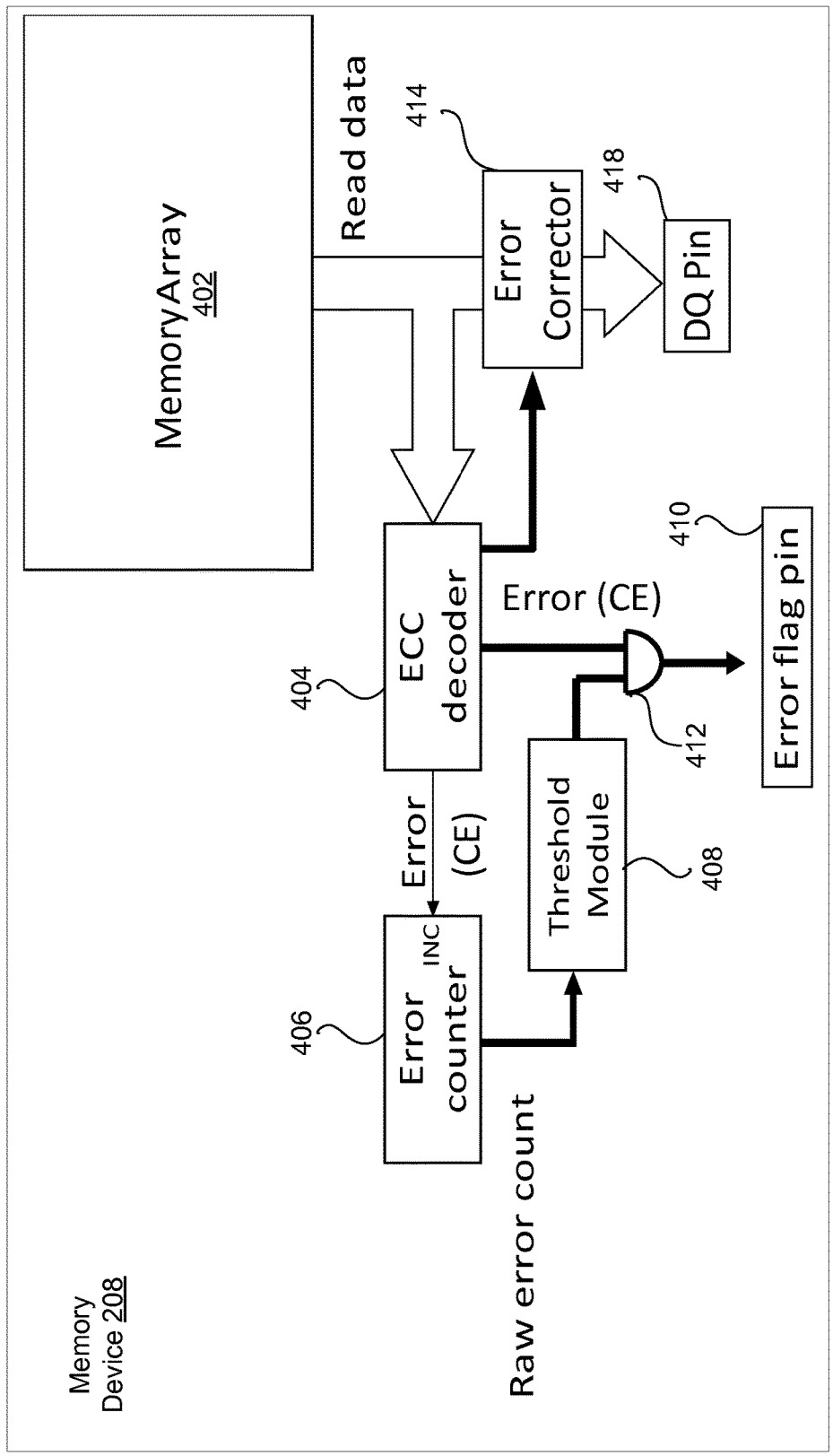
FIG. 4 is a block diagram of an example memory device configured to selectively report correctable memory errors, according to embodiments.

FIG. 4 is a block diagram of an example memory device 208 configured to selectively report correctable memory errors, according to embodiments. In some embodiments, the memory device 208 may include a memory array 402, an error counter 406, and ECC decoder 404, a threshold module 408, at least one AND gate 412, and error flag pin 410, an error corrector 414, and a DQ pin 418. In some embodiments, each of the components as illustrated in FIGS. 4, 5, 6, 7, and 8A may be located within a memory controller or other memory system in addition to or instead of the memory device 208.

The memory device 208 may include various types of memory structures. The memory devices 208 may include phase change memory, ferro-electric random access memory (FRAM), magnetic random access memory (MRAM), direct random access memory (DRAM), static random access memory (SRAM), resistive random access memory (RRAM), flash memory, etc.

The memory array 402 may be arranged in rows (e.g., wordlines) and columns (e.g., bitlines) of individual memory cells. Each memory cell may have a unique location or address defined by the intersection of a row and a column. In some embodiments, when a data word corresponding to a particular address is read from the memory array 402, Row Address Select (RAS) (Strobe) circuitry may be utilized to latch the row address needed for the read. Moreover, Column Address Select (CAS) (Strobe) circuitry may be utilized to latch a column address and initiate the read.

In embodiments, when data words are read or requested, an ECC decoder 404 may be utilized to decode current code words for the data to detect and/or correct memory errors. For example, a first data word within a first memory address may be read. The respective code word (e.g., data word plus check bits) at the memory address may then be compared to the original code word that was written (e.g., via an ECC encoder) to the memory array 402. Accordingly, the ECC decoder 404 may extract the check bits and data word bits from the code word. In embodiments, the ECC decoder 404 may recalculate the check bits and data word to determine whether there is an error (e.g., check the syndrome to determine whether there is an even or odd parity, as described herein). If there is an error, the ECC decoder 404 may utilize an error corrector 414 (e.g. XOR) to correct the memory errors that are detected. In some embodiments, the error corrector 414 may be within the ECC decoder 404 such that the ECC decoder can both detect and correct memory errors. In other embodiments, a memory controller (which may have ECC encoder and ECC decoder 404) may detect and/or correct memory errors.

The ECC decoder 404 and/or the error corrector 414, or any analogous components as found in FIG. 5, FIG. 6, FIG. 7, or FIG. 8A may utilize various error correction and detection mechanisms. For example, error detection mechanisms may include: ECC, Repetition Codes, Parity Bits, Checksums, Cyclic Redundancy Checks (CRCs), Cryptographic Hash functions, and/or any other suitable detection mechanism. Examples of error correction mechanisms include ECC, Automatic Repeat Request (ARQ) mechanisms, hybrid mechanisms, and/or any other suitable error correcting mechanisms.

In some embodiments, the ECC used to detect and correct various errors may include different error correcting codes, such as block codes or convolution codes. For example the ECC may be Hamming codes, Bose-Chaudur-Hocquengem (BCH) codes, Reed-Solomon (RS) codes, Low-Density parity check codes, or any other suitable ECC.

In some embodiments, once an ECC decoder 404 detects an error and the error is a correctable memory error, an error counter 406 may update a "raw" or actual error count of the various memory errors or correctable memory errors (e.g., an error count may have been updated from 100 to 101). In some embodiments, after a raw error count has been updated, a threshold module 408 may determine whether the updated error count has caused the error count to exceed an error count threshold value. The error count threshold value may be any suitable value to balance the needs of a user for progressively monitoring memory health while at the same time not reporting every single error to a user for business-related purposes. For example, if the correctable error count exceeds 20,000 correctable errors (i.e., the threshold value), then the threshold module 408 may communicate with the error flag pin 410 such that the raw error count of 20,000 correctable errors is reported to a user. If the error count does not exceed a threshold value, then the raw error count quantity may never be reported (e.g., via the error flag pin 410). In alternative embodiments, a memory controller or system firmware may poll the error counter 406 at a particular time interval (e.g., every hour) to determine whether the error count is above a threshold value, as opposed to determining if the error count is above a threshold value after every determined correctable memory error. In some embodiments, the threshold module 408 may be a comparator circuit, an operating system component, or any other suitable component to count raw errors. In some embodiments, the threshold module 408 is located within a memory controller.

In an example illustration, the error counter 406 (or error counters 506, 606, 706, and 806 described below) may be reset to 0 when a user sends an "error count enable" command (described in more detail below) to a first address. A user may send an "error count enable" command after a memory device has been read for error counts for a given time period. For example, if every 20 minutes, a particular memory address is read or polled to determine whether the address contains a memory error, and then a particular second read of the address occurred again after a five minute mark, then the error count may be reset to zero because the read time (5 minutes) was not consistent with the regular read interval (20 minutes), which may suggest that a user tried to have unauthorized access to a memory error count.

In another example, in some embodiments a memory device may store a last set of addresses using a "First In First Out" (FIFO) method. FIFO systems may utilize the FIFO method for organizing and manipulating data such that the oldest address requests are fetched first. If a new or repeated address is found in the FIFO system, then the error counter 406 may be reset. For example, if one of a plurality of addresses has not been read, via an error count enable command, in a sequential order, then in response to the read of the non-sequential order, the correctable memory error count may be reset to a quantity of zero. The reading of non-sequential addresses is discussed in more detail below with respect to FIG. 8A.

In embodiments, the AND gate 412 is utilized to ensure both inputs from the ECC decoder 404 and threshold module 408 are high. For example, in some embodiments, in order for the error flag pin 410 to be activated there must be a correctable error as determined by the ECC decoder 404 and the threshold module 408 must determine that an error count is above a threshold. The DQ pin 418 (e.g., the data pin) is used for output. During a read operation of a data word, data read from a selected memory cell may appear at the DQ pin 418 once access is complete and the output is enabled (e.g., via an output enable (OE) pin).

Figure 5:
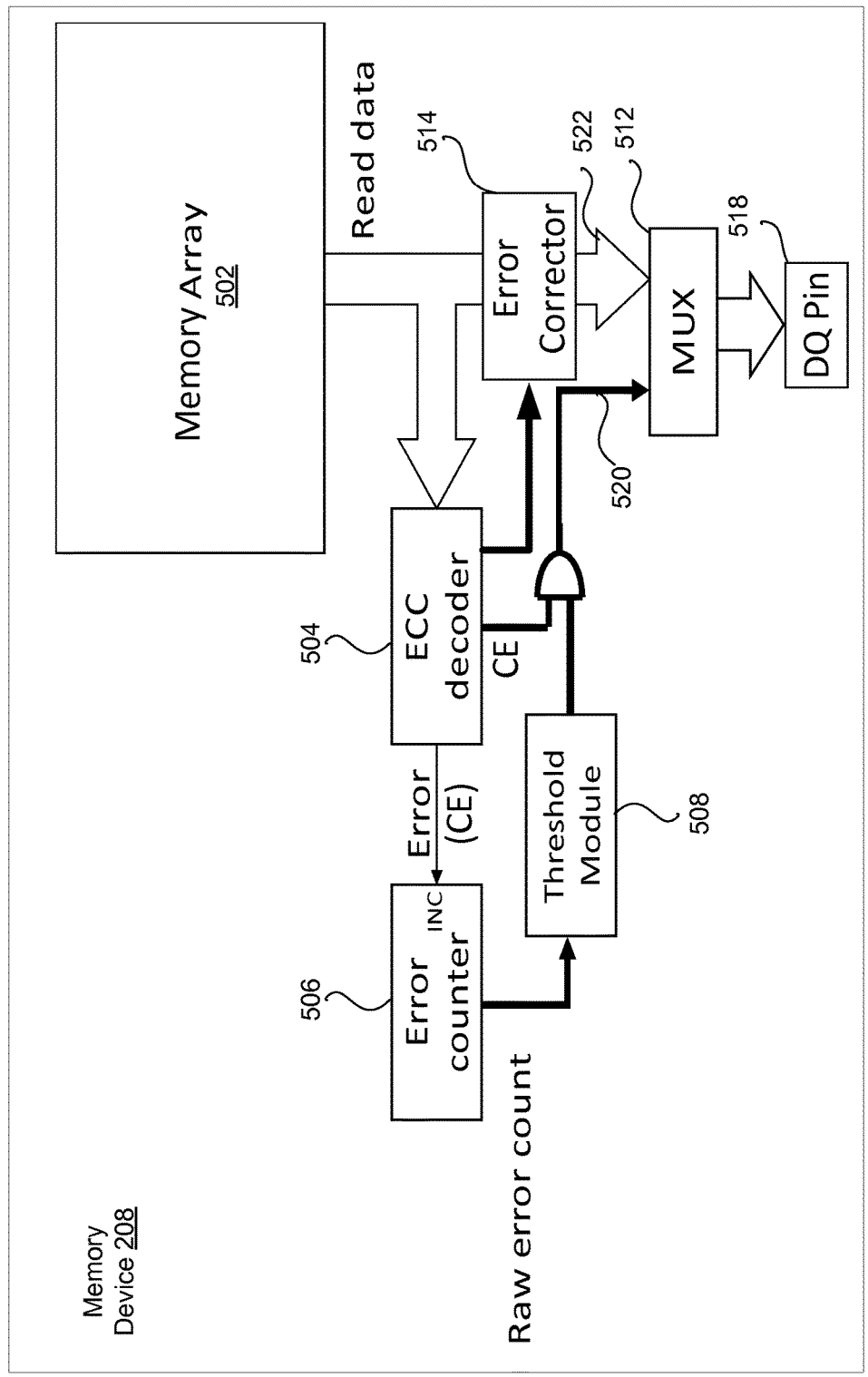
FIG. 5 is a block diagram of an example memory device configured to selectively report correctable memory errors, according to embodiments.

FIG. 5 is a block diagram of an example memory device 208 configured to selectively report correctable memory errors, according to embodiments. The memory device 208 may include a memory array 502, an error counter 506, an ECC decoder 504, a threshold module 508, an error corrector 514, a multiplexer 512, and a DQ pin 518. In some embodiments, when a data word is read from a particular address within the memory array 502, the ECC decoder 504 may determine whether there are various correctable memory errors and if there are correctable memory errors, the error corrector 514 may correct the memory errors as described above. Moreover, the error counter 506 may also count the amount of correctable errors and the threshold module may determine whether the error count exceeds a threshold, as described above. In some embodiments, after the ECC decoder 504 determines that there is a correctable memory error and the threshold module determines that the raw error count is above a threshold value, the multiplexer 512 may be utilized via system firmware (e.g., a hypervisor) to select either the output signal 520 (which includes the error count) or the read data signal 522 as an output signal to place at the DQ pin 518. In some embodiments, the system firmware may set a mode bit, which is a flag that selects between two or more operations (e.g., the output signal 520 or the read data signal 522) to place at the DQ pin 518. Therefore, at a particular time the read data signal 522 or the output signal may be placed at the DQ pin 518 either to read the data or report a correctable memory error that causes an error count to reach or exceed an error count threshold respectively.

Figure 6:
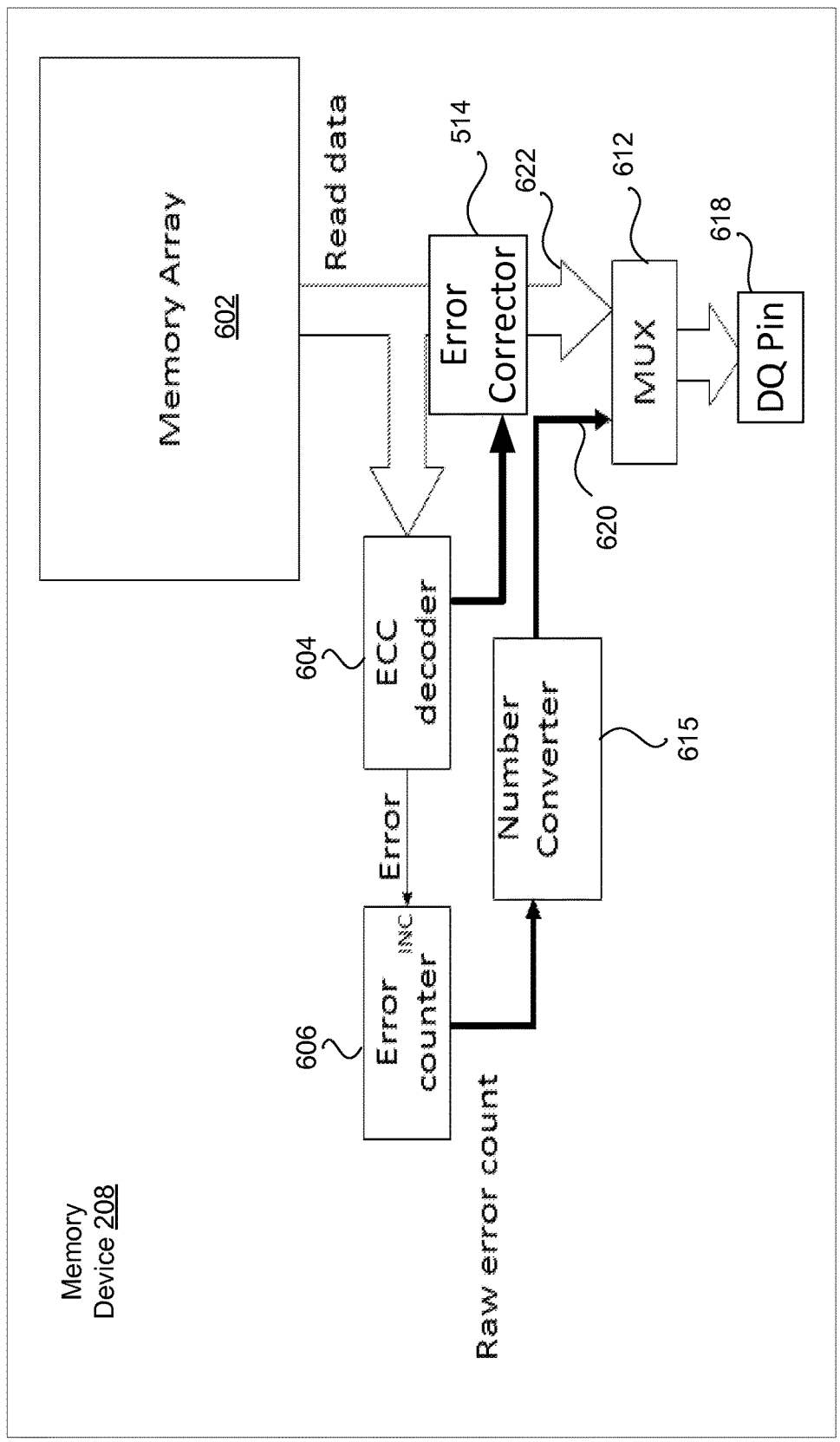
FIG. 6 is a block diagram of an example memory device configured to selectively report correctable memory errors, according to embodiments.

FIG. 6 is a block diagram of an example memory device 208 configured to selectively report correctable memory errors, according to embodiments. The memory device 208 may include a memory array 602, an error counter 606, an ECC decoder 604, a number converter 615, an error corrector 614, a multiplexer 612, and DQ pins 518. In some embodiments, when a data word is read from a particular address within the memory array 602, the ECC decoder 604 may determine whether there are various correctable memory errors and if there are correctable memory errors the error corrector 614 may correct the memory errors as described above.

In some embodiments, as illustrated in FIG. 6, a number converter 615 may convert the raw error count derived from the error counter 606 such that the converted error count is lower than the actual raw error count for reporting purposes. As disclosed herein, to "convert" a memory error may be to reduce the quantity of correctable memory errors that an error counter counts for reporting purposes. Converting a correctable memory error count may be useful for reducing the quantity of correctable memory errors that are reported to a user/memory controller to exclude noise associated with random soft errors. Converting correctable memory errors may therefore be useful for a user needing to accurately monitor progressive memory health and memory suppliers not wanting to disclose each and every correctable memory error.

In an example illustration, for every 3 memory errors (raw error count of 3), the number converter 615 may convert the memory error to 1 (raw error count of 1) such that 1 memory error is reported instead of 3. Any suitable linear or non-linear algorithm may be utilized by the number converter 615 to convert the raw error count. For example the following algorithm may be utilized—$F(X)=B*\max(X-A,0)$, where "X" is the raw error count, "A" is a threshold quantity of errors is needed before conversion, and "B" is a scaling factor to make the reported error count not correlate with the actual number of errors. In some embodiments, the number converter 615 may not be utilized until an error count has reached a threshold value. For example, a threshold value may be greater or equal than 20 raw memory errors. Accordingly, errors 1-19 may not be reported to a host device (e.g., memory controller) and be corrected without any interference from the number converter 615. However, in response to the ECC decoder 604 detecting memory error number 20, the memory device 208 may report and number converter 615 may reduce every memory error thereafter by a factor of 3, 5, or any other suitable value. For example, instead of reporting that error number 20 has occurred, the memory device 208 may report that the error count is actually 17.

In some embodiments, after the ECC decoder 604 determines that there is a correctable memory error and the number converter 615 converts the raw memory error count, the multiplexer 612 may be utilized via system firmware (e.g., a hypervisor) to select either the output signal 620 (corresponding to the converted error count) or the read data signal 622 as an output signal to place at the DQ pins 518. In some embodiments, the system firmware may set a mode bit, which is a flag that selects between two or more operations (e.g., the output signal 620 or the read data signal 622) to place at the DQ pins 618. Therefore, at a particular time the read data signal 622 or the output signal may be placed at the DQ pins 618 either to read the data or to report an error count derived from a raw memory error count using a number conversion algorithm as a result of a correctable memory error causing the raw error count to reach or exceed an error count threshold, respectively.

Figure 7:
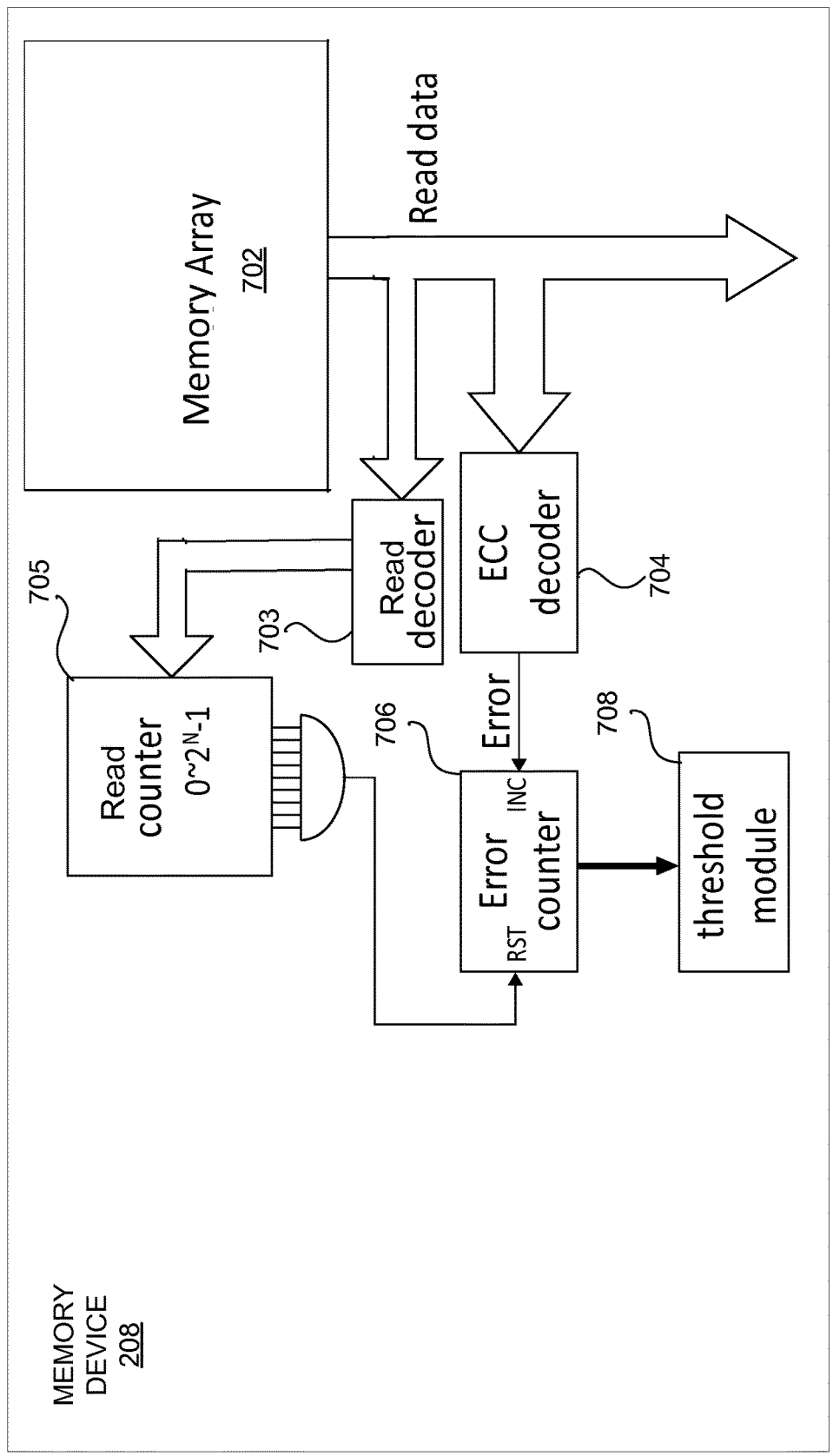
FIG. 7 is a block diagram of an example memory device configured to selectively report correctable memory errors, according to embodiments.

FIG. 7 is a block diagram of an example memory device 208 configured to selectively report correctable memory errors, according to embodiments. FIG. 7 may be an example of resetting the error counter 706 after a threshold quantity of read operations (e.g., RAS and CAS commands). The memory device 208 may include a memory array 702, a read decoder 703, an ECC decoder 704, a read counter 705, an error counter 706, and a threshold module 708.

In an example illustration, a host device, such as a memory controller may issue a read command at a first address to retrieve a particular memory cell of data within the memory array 702. A read decoder 703 may then receive the read command to latch on to the specific address. For example, in a DRAM memory system, a RAS circuitry module may latch the row address of the desired cell, and a CAS circuitry module may latch the column address. Moreover, a high logic voltage WE signal may be utilized to select a read operation. After the cell address has been latched and a read specified, a read counter 705 may count the particular read associated with the particular read operation and keep track of a history of each read performed at particular addresses. The read count indicates a quantity of data reads that have occurred at some of or each of the addresses within the memory device. For example, the read counter 705 may record a history specifying that addresses 0, 1, 2, and 3, were read. The history includes the aggregate quantity of reads from addresses 0, 1, 2, and 3. A host device may then request information from address 4, and the read counter 705 may record that address 4 was also read. In parallel with operations of the read counter 705, error counter 706 counts errors and the threshold module 708 determines whether the correctable memory error count is above a threshold. In some embodiments, after a time period (e.g., 1 hour), the read counter 705 may reset itself and the error counter 706. In some embodiments, however, when the read counter 705 has reached a threshold quantity of reads (e.g., 200 addresses), system firmware may reset the error counter 706 and read counter 705. For example, in various embodiments system firmware or the read counter 705 may reset the error counter 706 to 0 when each and every memory cell within the memory array 702 has been read once, as tracked by the read counter 705.

According to FIG. 7, and in some embodiments, when data is read and the ECC decoder 704 determines that there is a correctable memory error, the memory error count is updated by the error counter 706. If a threshold quantity of memory cell addresses have been read before the decoder 704 discovers the correctable memory error (e.g., each memory cell has been read once), and/or a threshold time period has passed, then the error counter 706 may be reset to 0 such that the memory system recognizes that there may be no correctable memory errors at any address. If the error count is reset to 0, or any other value below a threshold, the threshold module 708 may determine that the error count does not exceed an error count threshold, and may therefore selectively chose to not report the memory error. However, if a threshold quantity of memory cell addresses have not been read (e.g., only a few memory cells have been read), then the error counter 706 may not be reset such the memory system keeps cumulatively adding each memory error that is detected.

Figure 8A:
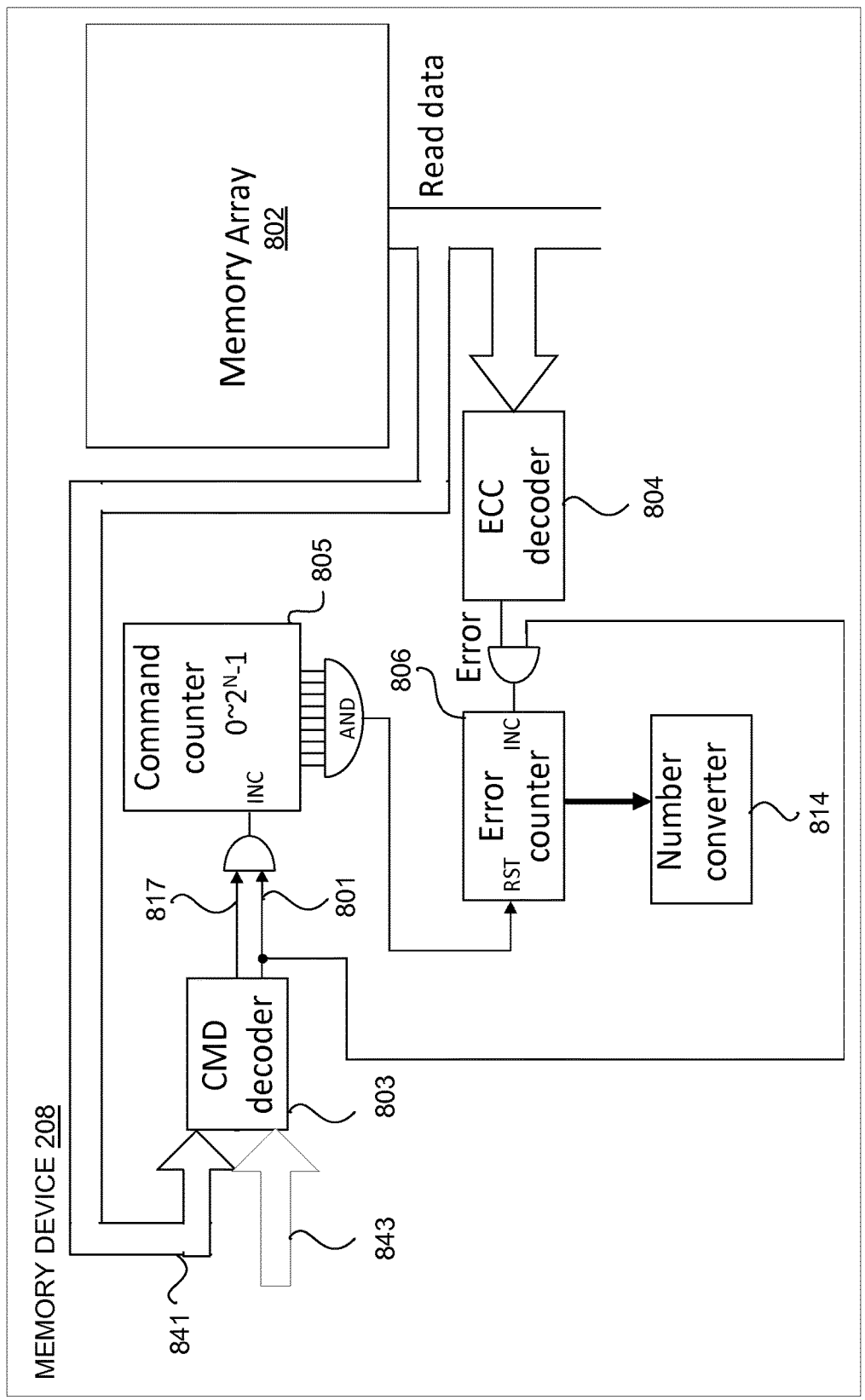
FIG. 8A is a block diagram of an example memory device configured to selectively report correctable memory errors, according to embodiments.

FIG. 8A is a block diagram of an example memory device 208 configured to selectively report correctable memory errors, according to embodiments. The memory device 208 as illustrated in FIG. 8A may utilize special read command circuitry (a special read command may be referred to herein as "error count enable command") to assess the quantity of correctable errors at a particular address only once, as some memory device error counters may count the same memory errors (e.g., errors at the same address) two or more times and therefore give a misleading error count to a user. The memory device 208 of FIG. 8A may include a memory array 802, a command decoder 803, an error count enable command 843 that is transmitted through an error count enable command wire 801, a conventional read operation 841 that is transmitted through a conventional read operation wire 817 (e.g., wire used for RAS, CAS, and WE signals), a command counter 805, a number converter 814, an error counter 806, and an ECC decoder 804.

In an example illustration, it may be desired to perform a test on a memory device. The test may test all or a subset of addresses within a memory device. First, a host device may assert an error count enable command 843 and perform a read operation specifying a first address within the memory array 802. When the error count enable signal is asserted, the command counter 805 is enabled to count read commands and the error counter 806 is enabled to count read errors. An error count enable command 843 may allow a host device to read a data cell within the memory array specifically for the purpose of checking or updating a memory error count (e.g., error counter 806) accordingly, as opposed to reading data for retrieval purposes via a conventional read operation 841 (e.g., utilizing RAS, CAS, and WE commands). In response to a host device asserting the error count enable command 843 and asserting a read command specifying the first address, the command counter 805 may count and record that the first address was read. In addition, if the ECC decoder 804 determines that there is a correctable memory error at the first address, the ECC decoder 804 causes the error counter 806 to increment an error count. On the other hand, if the ECC decoder 804 does not detect a correctable memory error at the first address, the error count is not incremented. The test on the memory device is continued by reading a second address while the error count enable signal remains asserted. The reading of the second address causes the command counter to increment the command count. The error count is incremented if an error is detected at the second address. The test may continue in this manner with additional read operations specifying third, fourth, and fifth address. As many additional read operations and addresses may be specified as desired. In one embodiment, all addresses within a memory device are read. In another embodiment, a subset of addresses within a memory device are read. In yet another embodiment, a sequential block of addresses within a memory device are read. At the conclusion of the test, the command counter will contain a count of the total number of read commands and the error counter will contain a count of the total number or errors. A percentage of addresses having memory read errors may be determined by dividing the total number of errors by the total read commands. In some embodiments, the command counter 805 does not count conventional read operations 141. Accordingly, the command counter 805 may only count error count enable commands 843.

In some embodiments, the command counter 805 may include a history of each error count enable command 843 such that when the command counter 805 has reached a particular threshold quantity of reads associated with different addresses (e.g., all of the addresses in the memory array 802), it may communicate with the error counter 806 to reset the error counter 806 to 0 (i.e., there are 0 memory errors). In some embodiments, the command counter 805 may reset the error counter 806 after a threshold time period (e.g., every hour) via a timer.

In some embodiments, a memory system may utilize various algorithms to request particular addresses during the error count enable command so as to prevent a potential hack of the selective error reporting mechanism of the memory system. For example, if a sequential algorithm was utilized by the memory system, at a first time, address 0 may be read for an error count enable command; at a second subsequent time, address 1 may be read for an error count enable command; at a third time (which is subsequent to the second time), address 2 may be read for an error count enable command. As described above, a user may engaging in a hacking action by may attempting to assert the error count enable command, but in doing so may issue the error count enable command in a manner inconsistent with the memory system's error count enable command algorithm. For example, using the illustration above, after address 2 was read during a regular error count enable command, and a second error count enable command tried to access address 4, then system firmware may alert the host device (e.g., via a dedicated flagging pin) to reset the error counter such that a user may not be able to view an error count.

In some embodiments, a user may try to perform a hacking method based on observing a correctable memory error count increase after repeatedly accessing a particular address. For example, the user may receive a report that an address contains a correctable memory error and repeatedly assert an error count enable command at a first address. Each time the user asserts the error count enable command, the user may try to increment the error counter such that the user may be able to discern at what point a correctable memory error is either converted or reported to the user (i.e., discover what the threshold value is). Accordingly, in order to prevent this hacking method, in some embodiments, the correctable memory error count may be reset to 0 after a special read command has already occurred at particular address such that the user will not be able to discover what the correctable memory error threshold value is.

In some embodiments, in addition to the command counter 805 counting the error count enable command 843, the error count enable command 843 is sent via the error count enable command wire 801 from the command decoder 803 to the error counter 806 as long as the ECC decoder 804 detects a memory error for the data that is part of the error count enable command 843. In some embodiments, once the error counter 806 counts the quantity of memory errors, the number converter 814 (e.g., as illustrated by the number converter 616 of FIG. 6) may convert the amount of correctable memory errors to any amount of errors, as discussed above. In other embodiments, instead of the number converter 814, the memory device 208 may utilize a threshold module (e.g., threshold module 408) as discussed in FIG. 4 above. In some embodiments, the threshold module may be attached to an error flag pin (e.g., error flag pin 410) as specified in FIG. 4 above. In some embodiments, the number converter 814 may be attached to a multiplexer (e.g., multiplexer 612) as specified in FIG. 6 above.

Figure 8B:
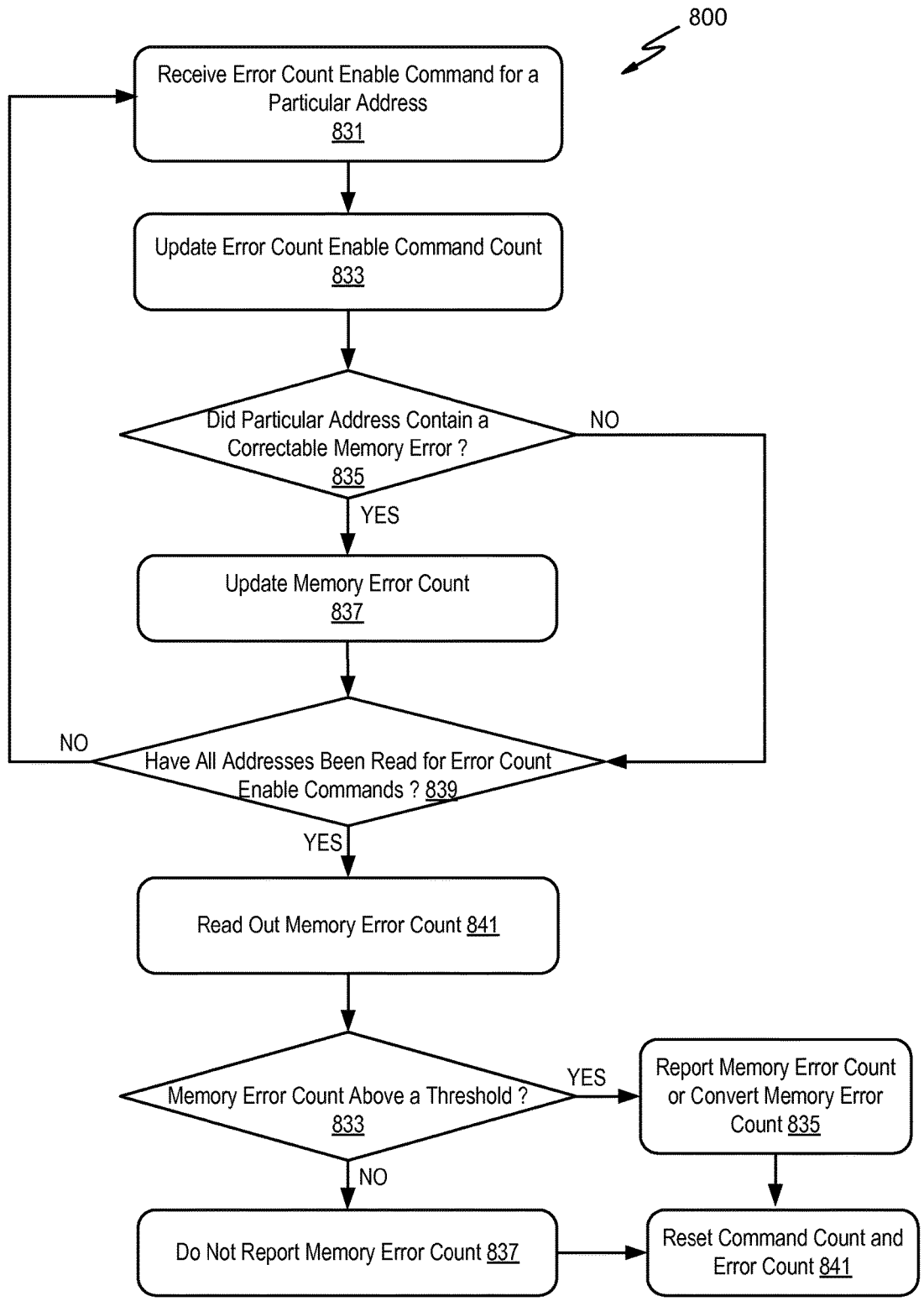
FIG. 8B is a flow diagram of an example process for determining whether a memory error count exceeds a threshold and reporting or converting the memory error count accordingly with respect to embodiments.

FIG. 8B is a flow diagram of an example process 800 for determining whether a memory error count exceeds a threshold and reporting or converting the memory error count accordingly with respect to embodiments. In some embodiments, the process 800 may be the method that the memory device 208 performs as illustrated in FIG. 8A. In some embodiments, the process 800 may begin, per block 831, when the memory device (e.g., command decoder 803) receives an error count enable command for a particular address. The memory device may accordingly, per block 833, update the error count enable command count (e.g., via the command counter 805).

Per block 835, the memory device may determine (e.g., via the ECC decoder 804) whether the particular memory address contains a correctable memory error. If the particular address does not contain a correctable memory error, then block 839 may be performed. If the particular address contained a memory error, then the memory device (e.g., via the error counter 806) may update the memory error count.

Per block 839, the memory device may determine, based on the error count enable command count, whether all of the addresses within the memory array have been read for various error count enable commands (e.g., via the command counter 805). If any of the addresses have not been read, then block 831 may be performed again for a different address, and blocks 833, 835, 837, and 839 may be repeated for the different address. If all of the addresses have been read for the error count enable command then, per block 841, the memory device may read out the memory error count or identify a plurality of correctable memory errors in response to determining that all of the addresses have been read. For example, after scanning each cell within a memory array, it may be determined that there exists 200 memory errors corresponding to particular data words.

Per block 833, the memory device may then determine whether the memory error count is above a threshold (e.g., via a threshold module). If the memory error count is above the threshold, then per block 835, the memory device may report the memory error count or convert the memory error count (e.g., via the number converter 814). In some embodiments, after block 835, the memory device may reset the command counter (e.g., the command counter 805) and an error counter (e.g., error counter 806). For example, if it was determined that each and every memory cell was read in a memory error, via the command counter (e.g., command count of 1 million), and there were over 200 errors, via the error counter, then the command counter may reset itself to 0 (i.e., there are currently no error count enable commands that have been performed), and further reset the error counter to 0 (i.e., there are currently no memory errors).

If the memory error count is not above a threshold in block 833, then per block 837, the memory device may select not to report the memory error count. For example, if the threshold value was 10 or more memory errors, and the memory device only counted 9 memory errors, then all 9 memory errors may not be reported to a host device. In some embodiments, after block 837 is performed, per block 841 a command and error counter may be reset, as described above.

What is claimed is:

1. A computer-implemented method for selectively reporting memory errors, the method comprising:
   identifying, by a computing device, a correctable memory error at a first address within a memory device;
   updating, by the computing device and based on at least the identifying, a first correctable memory error count from a first quantity to a second quantity;
   determining that the second quantity exceeds a threshold;
   converting, in response to the determining, the first correctable memory error count from the second quantity to a third quantity; and
   reporting the first correctable memory error count of the third quantity to a host device.

2. The method of claim 1, further comprising:
   receiving, prior to the identifying, a first error count enable command at the first address,
      wherein the first error count enable command requests information concerning whether there is the correctable memory error at the first address;
   updating, in response to the receiving, an error count enable command count from a first quantity to a second quantity;
   determining, based on the error count enable command count, that a plurality of addresses within the memory device have been read via the error count enable command, the plurality of addresses including the first address; and
   in response to the determining that the plurality of addresses within the memory device have been read, identifying a plurality of correctable memory errors, the plurality of correctable memory errors including the correctable memory error at the first address.

3. The method of claim 2, wherein the updating of the first correctable memory error count is further based on the identifying of the plurality of correctable memory errors.

4. The method of claim 2, wherein the error count enable command count is set to a quantity of zero after the reporting, and the first correctable memory error count is set to a fourth quantity of zero after the reporting.

5. The method of claim 2, further comprising:
   receiving a second error count enable command at the first address; and
   in response to the receiving of the second error count enable command at the first address, setting the first correctable memory error count to a fourth quantity of zero after the reporting.

6. The method of claim 2, further comprising:
   determining that one of the plurality of addresses has not been read in a sequential order, via the error count enable command; and
   in response to the determining that one of the plurality of addresses has not been read in the sequential order, setting the first correctable memory error count to a fourth quantity of zero after the reporting.

7. The method of claim 1, further comprising:
   receiving, prior to the identifying, a data read at the first address, wherein the data read requests data at the first address;
   updating, in response to the receiving, a first read count, wherein the first read count indicates a quantity of reads that have occurred at a plurality of addresses within the memory device, the plurality of addresses including the first address;
   determining, based on the first read count, that the plurality of addresses within the memory device have been read via the data read; and
   in response to the determining that the plurality of addresses within the memory device have been read, identifying a plurality of correctable memory errors, the plurality of correctable memory errors including the correctable memory error at the first address.

8. The method of claim 1, further comprising resetting the first correctable memory error count after a first time period.

9. A system for selectively reporting memory errors, the system having a processor and a memory system, the memory system further comprising:
   a memory controller configured to access data from a location within a memory array of a memory device;
   an error correcting code (ECC) decoder configured for identifying a correctable memory error at a first address within the memory device;
   an error counter configured for updating, based on at least the identifying, a first correctable memory error count from a first quantity to a second quantity;
   a threshold module configured for determining whether the second quantity exceeds a threshold; and
   a number converter configured for converting the first correctable memory error count from the second quantity to a third quantity when the second quantity exceeds the threshold, wherein the memory device is further configured for reporting to the memory controller the first correctable memory error count of the third quantity when the second quantity exceeds the threshold.

10. The system of claim 9, further comprising a number converter configured for converting the first correctable memory error count from the second quantity to a third quantity.

11. The system of claim 10, wherein the memory device is further configured for reporting to the memory controller the first correctable memory error count of the third quantity.

12. The system of claim 9, further comprising:
a command decoder configured for receiving, prior to the identifying, a first error count enable command at the first address, wherein the first error count enable command requests information concerning whether there is the correctable memory error at the first address;
a command counter configured for updating, in response to the receiving, an error count enable command count from a first quantity to a second quantity;
wherein the command counter is further configured for determining, based on the error count enable command count, that a plurality of addresses within the memory device have been read via the error count enable command, the plurality of addresses including the first address; and
in response to the determining that the plurality of addresses within the memory device have been read, the error counter is further configured for identifying a plurality of correctable memory errors, the plurality of correctable memory errors including the correctable memory error at the first address.

13. The system of claim 12, further comprising:
wherein the command decoder is further configured for receiving a second error count enable command at the first address; and
in response to the receiving of the second error count enable command at the first address, the command counter is further configured for setting the first correctable memory error count to a fourth quantity of zero after the reporting.

14. The system of claim 12, further comprising:
Wherein the command counter is further configured for determining that one of the plurality of addresses has not been read, via the error count enable command, in a sequential order; and
in response to the determining that one of the plurality of addresses has not been read in the sequential order, the command counter is further configured for setting the first correctable memory error count to a fourth quantity of zero after the reporting.

15. The system of claim 9, further comprising:
a read decoder configured for receiving, prior to the identifying, a data read at the first address, wherein the data read requests data at the first address;
a read counter configured for updating, in response to the receiving, a first read count, wherein the first read count indicates a quantity of reads that have occurred at a plurality of addresses within the memory device, the plurality of addresses including the first address;
wherein the read counter is further configured for determining, based on the first read count, that the plurality of addresses within the memory device have been read via the data read; and
in response to the determining that the plurality of addresses within the memory device have been read, the error counter is further configured for identifying a plurality of correctable memory errors, the plurality of correctable memory errors including the correctable memory error at the first address.

16. A memory device for selectively reporting memory errors, the memory device further comprising:
an error correcting code (ECC) decoder configured for identifying a correctable memory error at a first address within the memory device;
an error counter configured for updating, based on at least the identifying, a first correctable memory error count from a first quantity to a second quantity;
a threshold module configured for determining whether the second quantity exceeds a threshold; and
wherein, in response to the determining whether the second quantity exceeds the threshold, the memory device is further configured for reporting to a host device the first correctable memory error count of the second quantity when the second quantity exceeds the threshold, and the memory device is further configured for selecting to not report to the host device the first correctable memory error count of the second quantity when the second quantity does not exceed the threshold.

17. The memory device of claim 16, further comprising a number converter configured for converting the first correctable memory error count from the second quantity to a third quantity when the second quantity exceeds the threshold.

18. The memory device of claim 17, wherein the memory device is further configured for reporting to the host device the first correctable memory error count of the third quantity when the second quantity exceeds the threshold.

19. The memory device of claim 16, further comprising:
a command decoder configured for receiving, prior to the identifying, a first error count enable command at the first address, wherein the first error count enable command requests information concerning whether there is the correctable memory error at the first address;
a command counter configured for updating, in response to the receiving, an error count enable command count from a first quantity to a second quantity;
wherein the command counter is further configured for determining, based on the error count enable command count, that a plurality of addresses within the memory device have been read via the error count enable command, the plurality of addresses including the first address; and
in response to the determining that the plurality of addresses within the memory device have been read, the error counter is further configured for identifying a plurality of correctable memory errors, the plurality of correctable memory errors including the correctable memory error at the first address.

20. The memory device of claim 16, further comprising:
a read decoder configured for receiving, prior to the identifying, a read command at the first address, wherein the read command requests data at the first address;
a read counter configured for updating, in response to the receiving, a first read count, wherein the first read count indicates a quantity of reads that have occurred at a plurality of addresses within the memory device, the plurality of addresses including the first address;
wherein the read counter is further configured for determining, based on the first read count, that the plurality of addresses within the memory device have been read via the read command; and in response to the determining that the plurality of addresses within the memory device have been read, the error counter is further configured for identifying a plurality of correctable memory errors, the plurality of correctable memory errors including the correctable memory error at the first address.

\* \* \* \* \*